(12) United States Patent
Yang

(10) Patent No.: US 6,717,815 B2
(45) Date of Patent: Apr. 6, 2004

(54) HEAT DISSIPATION MODULE AND ITS FIXED MEMBER

(75) Inventor: Chi-Hsueh Yang, Keelung (TW)

(73) Assignee: Quanta Computer, Inc., Taoyuan (TW)

( * ) Notice: Subject to any disclaimer, the term of this patent is extended or adjusted under 35 U.S.C. 154(b) by 0 days.

(21) Appl. No.: 10/175,377

(22) Filed: Jun. 18, 2002

(65) Prior Publication Data

US 2003/0011996 A1 Jan. 16, 2003

(30) Foreign Application Priority Data

Jul. 11, 2001 (TW) .................................. 90211669 U

(51) Int. Cl.⁷ ................................................ H05K 7/20
(52) U.S. Cl. ....................... 361/719; 248/510; 257/719; 361/809; 411/510
(58) Field of Search ........................... 361/687, 703–705, 361/707–712, 717–719, 752, 784, 807–809, 810; 165/80, 3, 185; 403/408.1; 411/508–510; 248/505, 510; 257/718, 719, 722, 726, 727

(56) References Cited

U.S. PATENT DOCUMENTS

| | | | | |
|---|---|---|---|---|
| 3,688,635 A | * | 9/1972 | Fegen | 174/138 A |
| 4,806,064 A | * | 2/1989 | Breese | 411/479 |
| 4,855,873 A | * | 8/1989 | Bhargava et al. | 361/818 |
| 5,586,005 A | * | 12/1996 | Cipolla et al. | 361/719 |
| 6,049,455 A | * | 4/2000 | Nakamura et al. | |
| 6,201,697 B1 | * | 3/2001 | McCullough | 361/704 |

\* cited by examiner

*Primary Examiner*—Gerald Tolin
(74) *Attorney, Agent, or Firm*—Merchant & Gould P.C.

(57) ABSTRACT

A heat dissipation module and its fixed member. The fixed member is disposed on a main board and is provided with a base. The base is provided with a plurality of protrusions. Each of the protrusions is provided with a flange. By means of the flange, the protrusion is engaged with a fixed hole disposed on the main board. Alternatively, the base is provided with a plurality of engaging portions. By means of the engaging portions, the protrusion is engaged with the fixed hole disposed on the main board so that the fixed member is fixed on the main board.

13 Claims, 6 Drawing Sheets

HEAT DISSIPATION MODULE AND ITS FIXED MEMBER

BACKGROUND OF THE INVENTION

1. Field of the Invention

The present invention relates to a heat dissipation module and its fixed member; in particular, a heat dissipation module that can prevent the dissipated heat from being conducted to a computer housing.

2. Description of the Prior Art

Referring to FIG. 1 and FIG. 2, a conventional heat dissipation device 3 is disposed on a CPU 1. The conventional heat dissipation device 3 is provided with a square body, and a plurality of cooling fins 32 disposed in a parallel fashion on the body.

The heat dissipation device 3 is also provided with four second through holes 31. During the assembly, the heat dissipation device 3 is disposed on the CPU 1.

Furthermore, the CPU 1 is disposed on a main board 4 that is provided with a plurality of third through holes 41. A plurality of bosses 51 are disposed on a computer housing 5. Screws 6 are screwed to the bosses 51 through the second through holes 31 and the third through holes 41. Thus, the heat dissipation device 3 is assembled on the computer housing 5 via the CPU 1 and the main board 4.

However, when the velocity of the CPU increases, the amount of the heat dissipation generated by the CPU also increases. Thus, the dissipated heat, conducted to the computer housing 5 through the screws 6, is also increased. As a result, the temperature of the computer housing 5 exceeds a reference standard.

SUMMARY OF THE INVENTION

In order to address the disadvantages of the aforementioned heat dissipation device, the invention provides a heat dissipation module that can prevent its generated heat from conducting to a computer housing Accordingly, the invention provides a heat dissipation module for a computer housing. The computer housing is provided with a main board. The main board is provided with a CPU and a plurality of first fixed holes. The heat dissipation module comprises a heat dissipation device, a plurality of locking members, a base, and a plurality of flanges. The heat dissipation device is provided with a plurality of first through holes. The locking members correspond to the first through holes. The base, having a plurality of first protrusions corresponding to the first fixed holes, is disposed on the main board in a manner such that the base and the CPU are located at opposite sides of the main board. Each of the first protrusions is provided with a locking hole corresponding to the first through holes respectively. Thus, the locking members are connected with the locking holes through the first through holes so that the heat dissipation device abuts the CPU. The flanges are formed on the first protrusions respectively. Thus, the first protrusions are engaged with the first fixed holes via the flanges so that the base is fixed to the main board.

Furthermore, the computer housing is provided with a plurality of second protrusions corresponding to the first protrusions.

In a preferred embodiment, the present invention provides a fixed member for a heat dissipation module for a computer housing. The computer housing is provided with a main board, and the main board is provided with a plurality of first fixed holes. The fixed member comprises a base and a plurality of flanges. The base is provided with a plurality of first protrusions corresponding to the first fixed holes. The flanges are formed on the first protrusions. The first protrusions are engaged with the first fixed holes via the flanges so that the base is fixed to the main board.

In another preferred embodiment, the present invention provides a heat dissipation module for a computer housing. The computer housing is provided with a main board, and the main board is provided with a CPU, a plurality of second through holes, and a plurality of second fixed holes. The heat dissipation module comprises a heat dissipation device, a plurality of locking members, a base, and a plurality of engaging portions. The heat dissipation device is provided with a plurality of first through holes. The locking members correspond to the first through holes. The base, having a plurality of third protrusions corresponding to the second through holes respectively, is disposed on the main board in a manner such that the base and the CPU are located at opposite sides of the main board. Each of the third protrusions is provided with a locking hole corresponding to the first through holes respectively. Thus, the locking members are connected with the locking holes through the first through holes so that the heat dissipation device abuts the CPU. The engaging portions are formed on the base in a manner such that each of the engaging portions corresponds to the second fixed holes. The engaging portions are engaged with the second fixed holes so that the base is fixed to the main board.

Furthermore, each of the locking members comprises a pair of hooks.

In another preferred embodiment, the invention provides a fixed member for a heat dissipation device for a computer housing. The computer housing is provided with a main board, and the main board is provided with a plurality of second through holes and a plurality of second fixed holes. The fixed member comprises a base and a plurality of engaging portions. The base is provided with a plurality of third protrusions corresponding to the second fixed holes. The engaging portions are formed on the base in a manner such that each of the engaging portions corresponds to the second fixed holes. The engaging portions are engaged with the second fixed holes so that the base is fixed to the main board.

BRIEF DESCRIPTION OF THE DRAWINGS

The present invention can be fully understood from the following detailed description and preferred embodiment with reference to the accompanying drawings in which.

DETAILED DESCRIPTION OF THE INVENTION

First Embodiment

Figure 1:
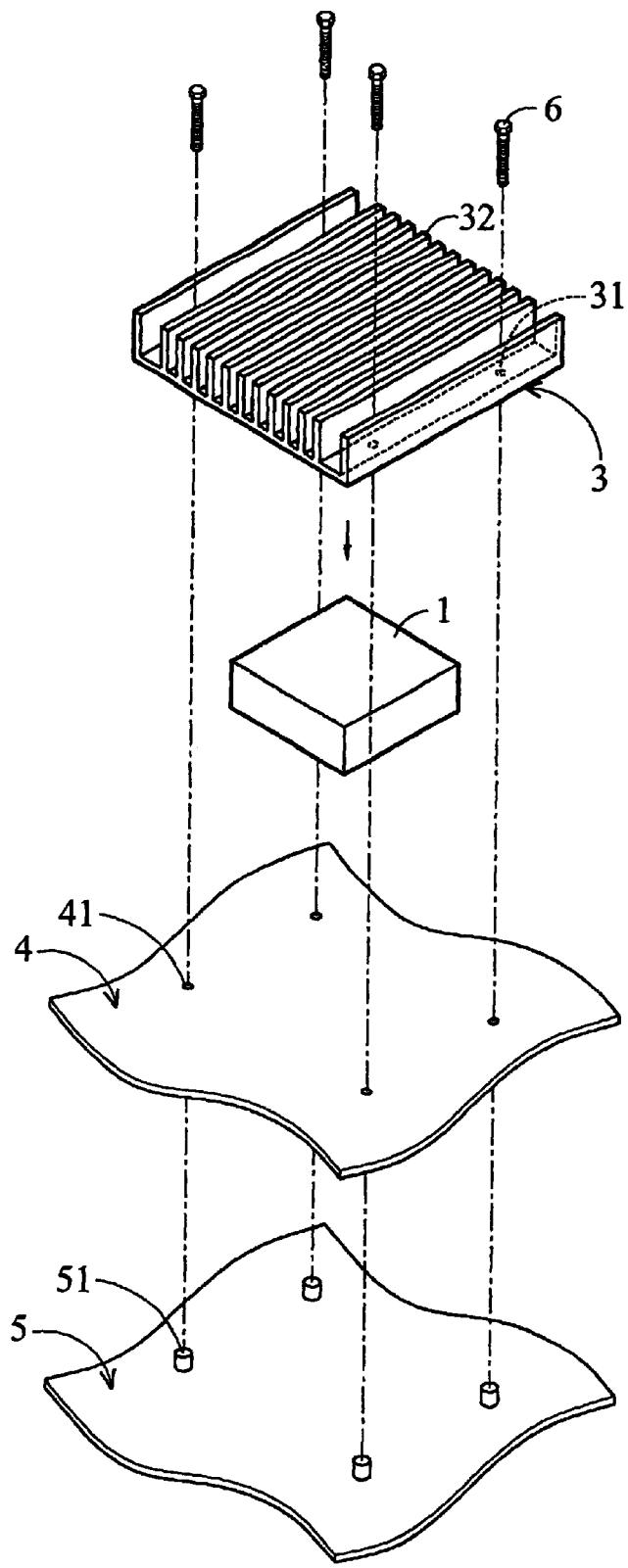
FIG. 1 is an exploded view that shows a conventional heat dissipation device, a main board, a computer housing and a CPU.
Figure 2:
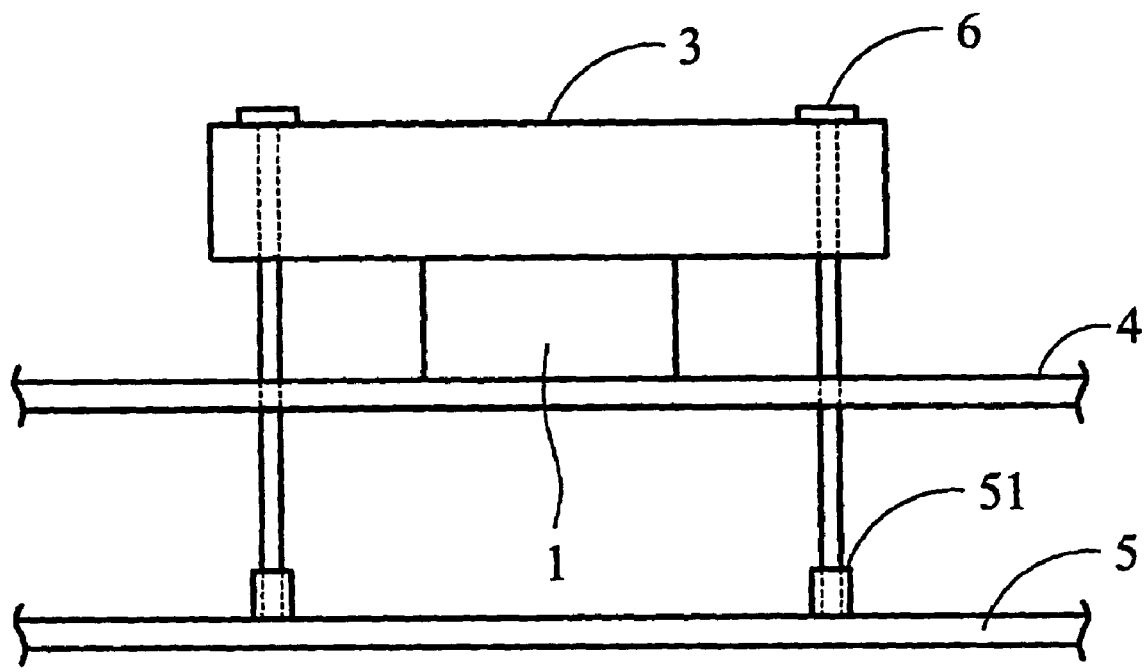
FIG. 2 is a side view that shows the assembly of the parts as shown in FIG.1.
Figure 3:
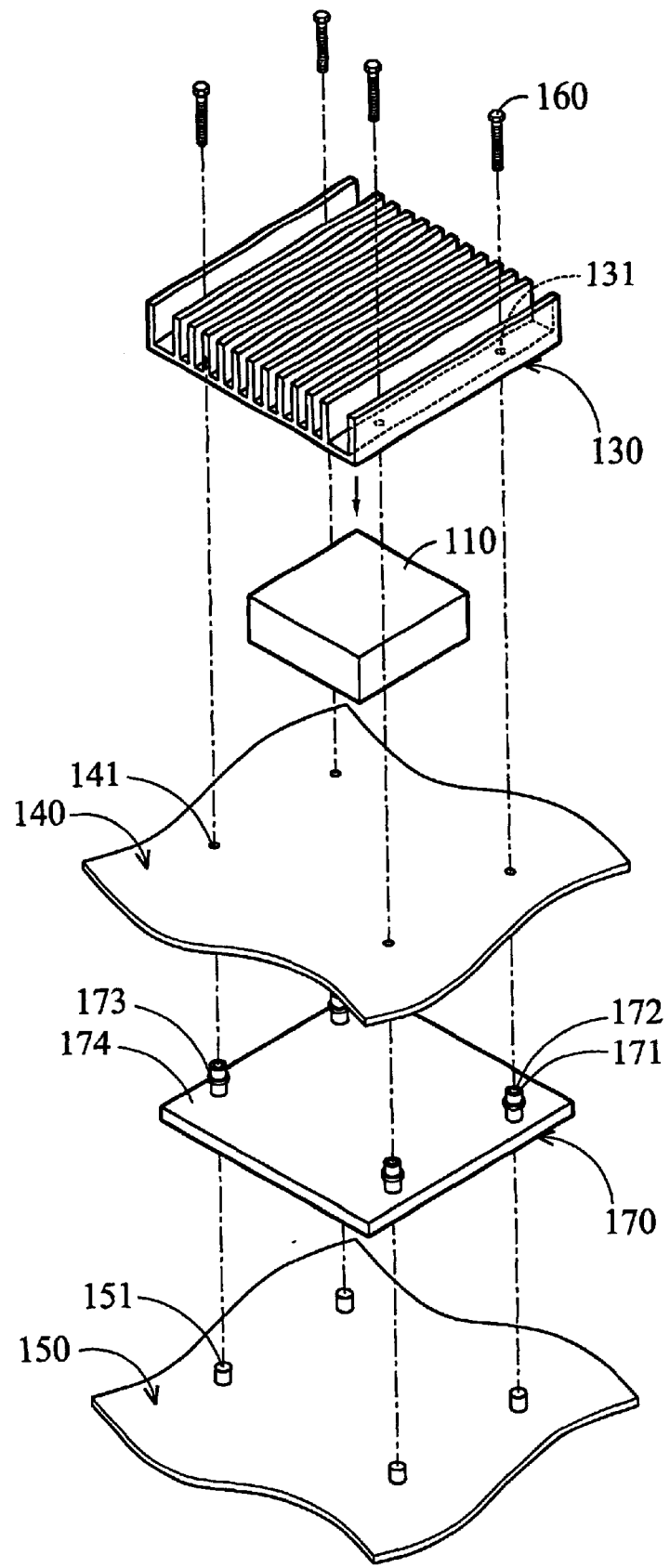
FIG. 3 is an exploded view that shows a heat dissipation module of a first embodiment of this invention, wherein a main board and a computer housing are also shown.
Figure 4:
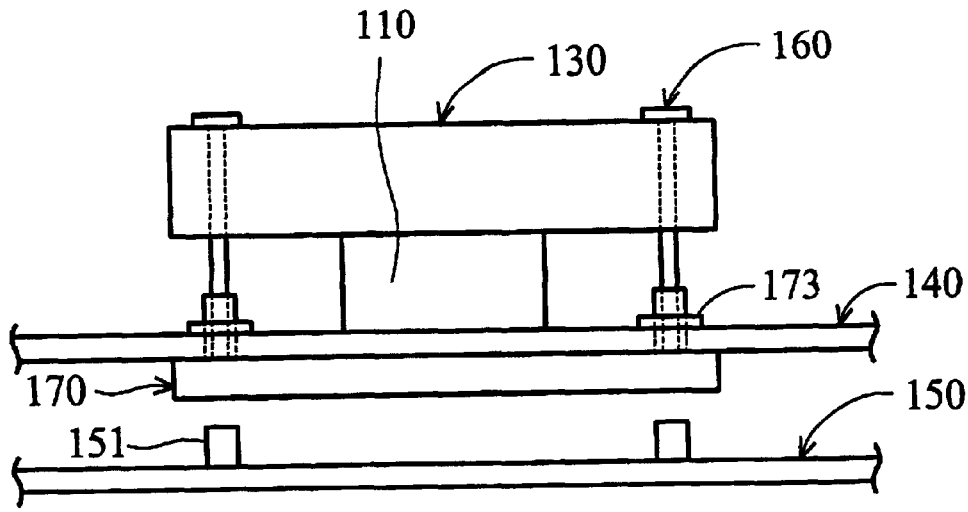
FIG. 4 is a side view that shows the assembly of the parts as shown in FIG. 3.

A heat dissipation module of a first embodiment as disclosed in the present invention is shown in FIGS. 3 and 4. The heat dissipation module is adapted for a computer (not shown). The computer has a main board 140 and a computer housing 150, and the main board 140 is disposed in the computer housing 150. The main board 140 is provided with a CPU 110 and four first fixed holes 141.

The heat dissipation module of the present embodiment comprises a heat dissipation device 130, four locking members 160, a base 174, and four flanges 173. The heat dissipation device 130 dissipates the heat generated from the CPU 110, and is provided with four first through holes 131. Each of the locking members 160 corresponds to the first through holes 131 respectively. The base 174 is disposed on the main board 140 in a manner such that the base 174 and the CPU 110 are located at opposite sides of the main board 140. The base 174 is provided with four first protrusions 171 corresponding to the first fixed holes 141, and each of the first protrusions 171 is provided with a locking hole 172 corresponding to the first through holes 131 respectively. Thus, the locking members 160 are connected with the locking holes 172 through the first through holes 131 so that the heat dissipation device 130 abuts the CPU 110. Each of the flanges 173 is formed on the first protrusions 171 respectively. By means of the flanges 173, the first protrusions 171 are engaged with the first fixed holes 141 so that the base 174 is fixed to the main board 140.

The base 174, the first protrusions 171 formed on the base 174, the locking holes 172 and the flanges 173 formed on the first protrusions 171 constitute of the fixed member 170 of this embodiment.

As stated above, the heat dissipation device 130 is not directly in contact with the computer housing 150. Therefore, the heat generated from the heat dissipation device 130 is not conducted to the computer housing 150, and consequently the temperature of the computer housing 150 is controlled within a reference standard.

Furthermore, the computer housing 150 is provided with four second protrusions 151 corresponding to the first protrusions 171. Thus, when the locking members 160 are connected with the first protrusions 171, the second protrusions 151 can support the base 174 if the base 174 is bent due to external force. As a result, the locking members are easily connected with the first protrusions 171.

Moreover, the locking members 160 are preferably screws. In addition, the number of through holes, fixed holes, protrusions, and locking members is not limited to the amount provided in this embodiment as long as the above function can be attained.

Figure 5:
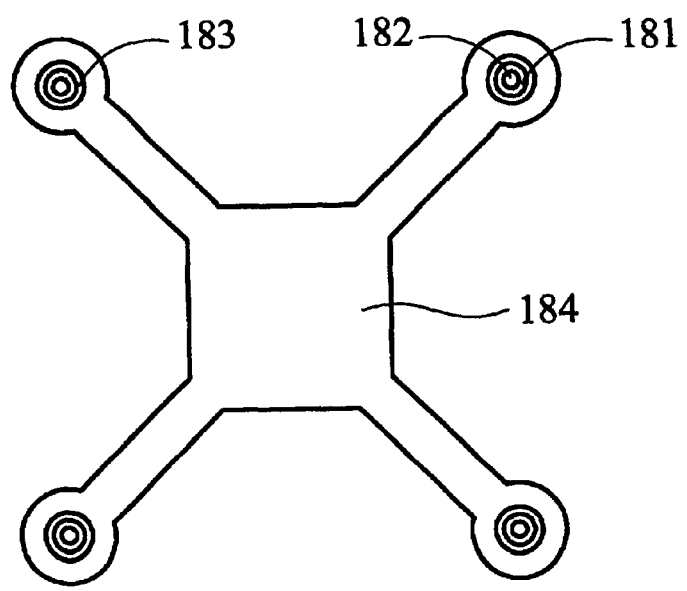
FIG. 5 is a schematic view illustrating a variant embodiment of a fixed member of the first embodiment of this invention.

Furthermore, FIG. 5 shows a variant embodiment of the fixed member for the heat dissipation module of this embodiment. Like the fixed member 170, the fixed member 180 comprises abase 184, first protrusions 181 formed on the base 184, and locking holes 182 and flanges 183 formed on the first protrusion 181. The difference between the fixed member 180 and the fixed member 170 is that the shape of the base 184 is different from that of the base 174. Thus, material is reduced, as is the weight. In addition, the fixed member 180 can be easily assembled due to a predetermined orientation.

Second Embodiment

Figure 6:
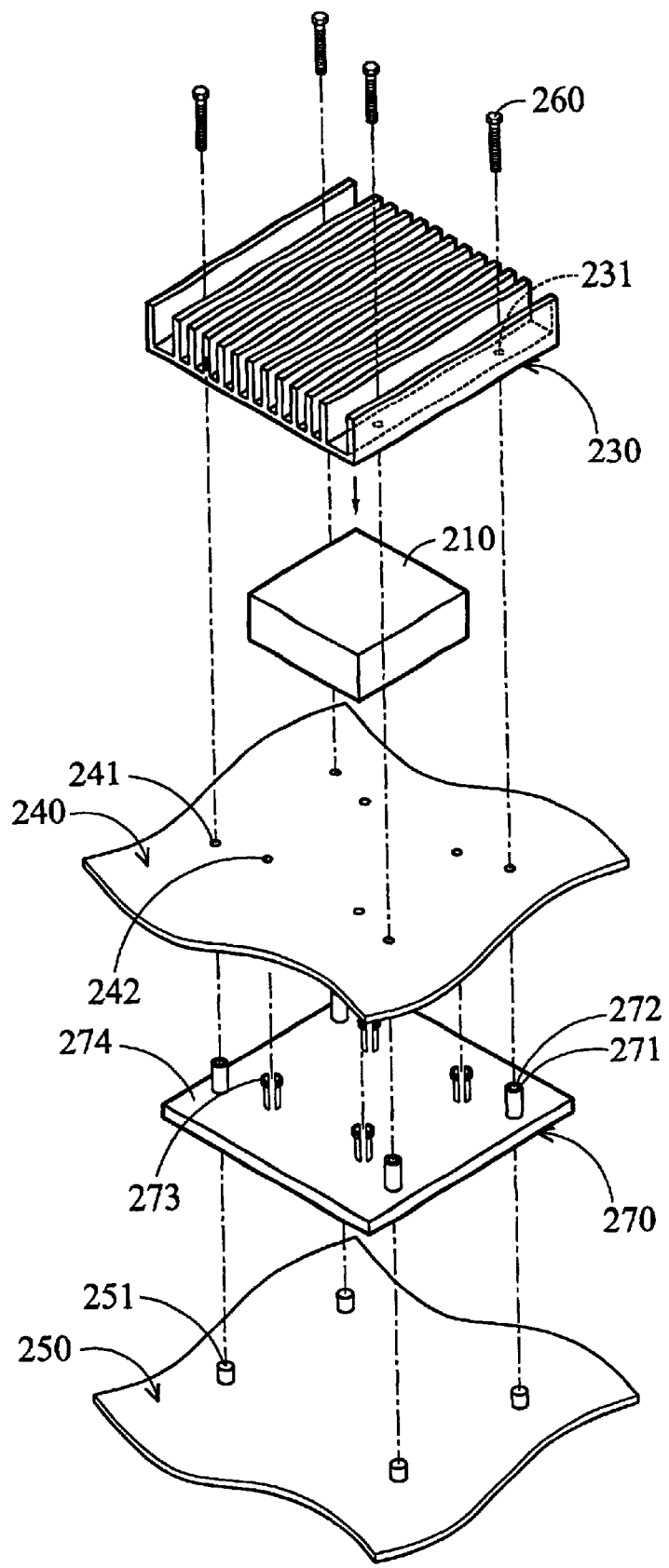
FIG. 6 is an exploded view that shows a heat dissipation module of a second embodiment of this invention, wherein a main board and a computer housing are also shown.
Figure 7:
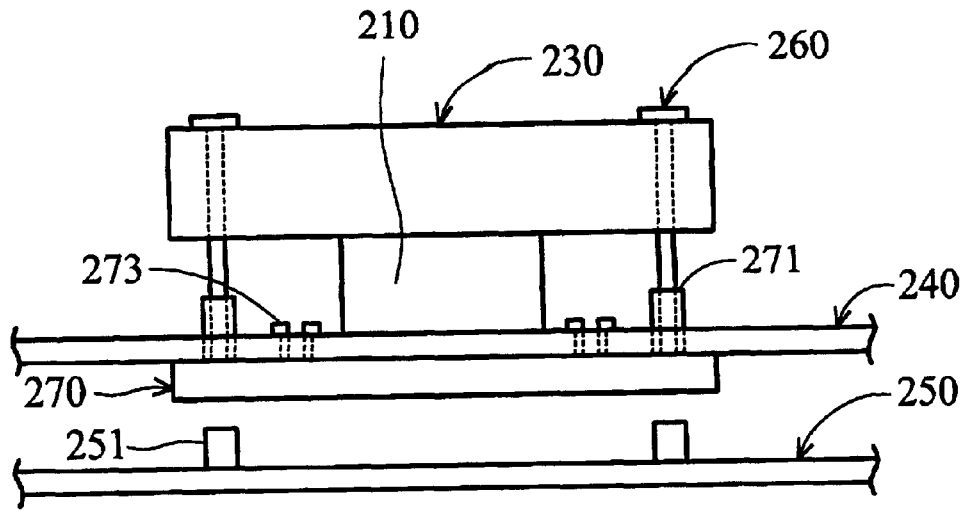
FIG. 7 is a side view that shows the assembly of the parts as shown in FIG. 6.

A heat dissipation module of a second embodiment as disclosed in this invention is shown in FIGS. 6 and 7. The heat dissipation module is adapted for a computer housing 250. The computer housing 250 is provided with a main board 240, and the main board 240 is provided with a CPU 210, four second through holes 241, and four second fixed holes 242.

The heat dissipation module of this embodiment comprises a heat dissipation device 230, four locking members 260, a base 274, and four engaging portions 273. The heat dissipation device 230 dissipates the heat generated from the CPU 210, and is provided with four first through holes 231. The locking members 260 correspond to the first through holes 231, and the base 274 is disposed on the main board 240 in a manner such that the base 274 and the CPU 210 are located at the opposite sides of the main board 240. The base 274 is provided with four third protrusions 271 corresponding to the second through holes 241. Each of the third protrusions 271 is provided with a locaking hole 272 corresponding to the first through holes 231. Thus, the locking memers 260 are locked with the locking hoels 272 through the first through holes 231 so that the heat dissipation device 230 abuts the CPU 210. The engaging portions 273 are preferably a pair of hooks and engaged with the second fixed holes 242 so that the base 274 is fixed to the main board 240.

The base 274, the third protrusions 271 and the engaging portions 273 formed on the base 274, and the locking holes 272 formed on the third protrusions 271 constitute the fixed member 270 of this embodiment.

As stated above, the heat dissipation device 230 is not directly in contact with the computer housing 250. Therefore, the heat generated from the heat dissipation device 230 is not conducted to the computer housing 250, and consequently the temperature of the computer housing 250 is controlled within a reference standard.

Furthermore, the computer housing 250 is provided with four second protrusions 251 corresponding to the third protrusions 271. When the locking members 260 are connected with the third protrusions 271, the second protrusions 251 can support the base 274 if the base 274 is bent due to external force. As a result, the locking members 260 are easily connected with the third protrusions 271.

Moreover, the locking members 260 are preferably screws. In addition, the number of through holes, fixed holes, protrusions, and locking members is not limited to the amount provided in this embodiment as long as the above function can be attained.

Figure 8:
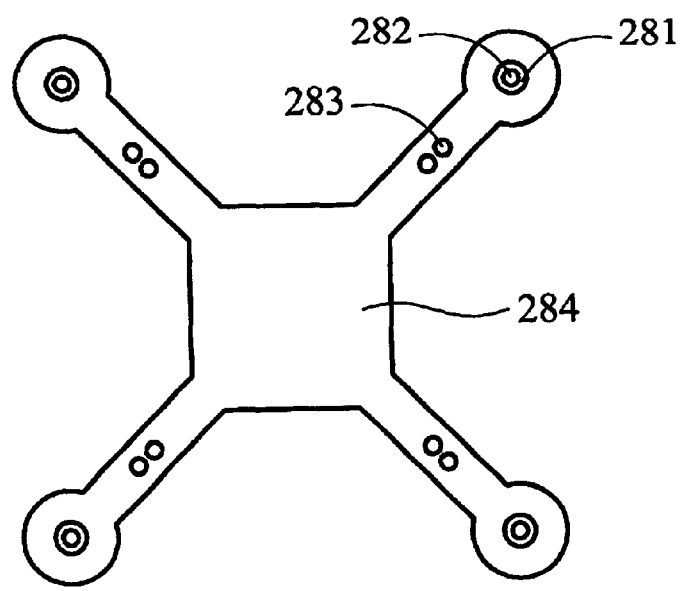
FIG. 8 is a schematic view illustrating a variant embodiment of a fixed member of the second embodiment of this invention.

Furthermore, FIG. 8 shows a variant embodiment of a fixed member for a heat dissipation module of this embodiment. Like the fixed member 270, the fixed member 280 comprises a base 284, third protrusions 281 and engaging portions 283 formed on the base 284, and locking holes 282 formed on the third protrusion 281. The difference between the fixed member 280 and the fixed member 270 is that the shape of the base 284 is different from that of the base 274. Thus, material is reduced, as is the weight. In addition, the fixed member 280 can be easily assembled due to a predetermined orientation.

Furthermore, in this embodiment, each of the engaging portions comprises a pair of hooks respectively.

While the invention has been described with reference to a preferred embodiment, the description is not intended to be construed in a limiting sense. It is therefore contemplated that the appended claims will cover any such modifications or embodiments as may fall within the scope of the invention defined by the following claims and their equivalents.

What is claimed is:

1. A heat dissipation module for a main board, wherein the main board is provided with a CPU and a plurality of fixed holes, the heat dissipation module comprising:

a heat dissipation device having a plurality of through holes;

a plurality of locking members corresponding to the through holes respectively;

a base, having a plurality of protrusions corresponding to the fixed holes, disposed on the main board in a manner such that the base and the CPU are located at opposite sides of the main board, wherein each of the protrusions is provided with a locking hole corresponding to the through holes respectively, whereby the locking members are connected with the locking holes through the through holes so that the heat dissipation device abuts the CPU; and a plurality of flanges formed on the protrusions respectively, whereby the protrusions are engaged with the fixed holes via the flanges so that the base is fixed to the main board.

2. The heat dissipation module of claim 1, wherein each of the locking members is a screw respectively.

3. A heat dissipation module for a main board, wherein the main board is provided with a CPU, a plurality of second through holes, and a plurality of fixed holes, and the heat dissipation module comprising:

a heat dissipation device having a plurality of first through holes corresponding to the second through holes;

a plurality of locking members corresponding to the first through holes;

a base, having a plurality of protrusions corresponding to the second through holes respectively, disposed on the main board in a manner such that the base and the CPU are located at opposite sides of the main board, wherein each of the protrusions is provided with a locking hole corresponding to the first through holes respectively, whereby the locking members are connected with the locking holes through the first through holes so that the heat dissipation device abuts the CPU; and a plurality of engaging portions formed on the base in a manner such that each of the engaging portions corresponds to the fixed holes respectively, wherein the engaging portions are engaged with the fixed holes so that the base is fixed to the main board.

4. The heat dissipation module of claim 3, wherein each of the engaging portions comprises a coupled of hooks respectively.

5. The heat dissipation module of claim 3, wherein each of the locking members is a screw respectively.

6. A heat dissipation module for a computer housing, wherein the computer housing is provided with a main board, and the main board is provided with a CPU, a plurality of through holes, and a plurality of second fixed holes, and the heat dissipation module comprising:

a heat dissipation device having a plurality of first through holes corresponding to the second through holes;

a plurality of locking members corresponding to the first through holes respectively;

a base, having a plurality of first protrusions corresponding to the second through holes respectively, disposed on the main board in a manner such that the base and the CPU are located at opposite sides of the main board, wherein each of the first protrusions is provided with a locking hole corresponding to the first through holes respectively, whereby the locking members are connected with the locking holes through the first through holes so that the heat dissipation device abuts the CPU; and a plurality of engaging portions formed on the base in a manner such that each of the engaging portions corresponds to the fixed holes respectively, wherein the engaging portions are engaged with the fixed holes so that the base is fixed to the main board.

7. The heat dissipation module of claim 6, wherein each of the engaging portions comprises a pair of hooks respectively.

8. The heat dissipation module of claim 6, wherein the computer housing is provided with a plurality of second protrusions corresponding to the first protrusions.

9. The heat dissipation module of claim 8, wherein each of the locking members is a screw respectively.

10. A heat dissipation module comprising:

a main board having a CPU and a plurality of fixed holes;

a heat dissipation device having a plurality of through holes;

a plurality of locking members corresponding to the through holes respectively;

a base, having a plurality of protrusions corresponding to the fixed holes, disposed on the main board in a manner such that the base and the CPU are located at opposite sides of the main board, wherein each of the protrusions is provided with a locking hole corresponding to the through holes respectively, whereby the locking members are connected with the locking holes through the through holes so that the heat dissipation device abuts the CPU; and a plurality of flanges formed on the protrusions respectively, whereby the protrusions are engaged with the fixed holes via the flanges so that the base is fixed to the main board.

11. A computer, comprising:

a computer housing;

a main board having a CPU and a plurality of fixed holes;

a heat dissipation device having a plurality of through holes;

a plurality of locking members corresponding to the through holes respectively;

a base, having a plurality of protrusions corresponding to the fixed holes, disposed on the main board in a manner such that the base and the CPU are located at opposite sides of the main board, wherein each of the protrusions is provided with a locking hole corresponding to the through holes respectively, whereby the locking members are connected with the locking holes through the through holes so that the heat dissipation device abuts the CPU; and a plurality of flanges formed on the protrusions respectively, whereby the protrusions are engaged with the fixed holes via the flanges so that the base is fixed to the main board.

12. The heat dissipation module of claim 11, wherein the computer housing is provided with a plurality of second protrusions corresponding to the first protrusions.

13. The heat dissipation module of claim 11, wherein each of the locking members is a screw respectively.

* * * * *